(12) United States Patent
Yan et al.

(10) Patent No.: US 9,642,206 B2
(45) Date of Patent: May 2, 2017

(54) COMPACT EMITTER FOR WARM DIMMING AND COLOR TUNABLE LAMP

(71) Applicant: LedEngin, Inc., San Jose, CA (US)

(72) Inventors: Xiantao Yan, Palo Alto, CA (US); Kachun Lee, Fremont, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 14/952,648

(22) Filed: Nov. 25, 2015

(65) Prior Publication Data

US 2016/0149088 A1 May 26, 2016

Related U.S. Application Data

(60) Provisional application No. 62/085,059, filed on Nov. 26, 2014.

(51) Int. Cl.
*H01L 33/48* (2010.01)
*H01L 33/62* (2010.01)
(Continued)

(52) U.S. Cl.
CPC ..... *H05B 33/0857* (2013.01); *H01L 25/0753* (2013.01); *H01L 33/62* (2013.01);
(Continued)

(58) Field of Classification Search
CPC ... H01L 33/483; H01L 33/62; H01L 25/0753; H05B 33/0857
See application file for complete search history.

(56) References Cited

U.S. PATENT DOCUMENTS

| | | |
|---|---|---|
| 5,959,316 A | 9/1999 | Lowery |
| 6,127,783 A | 10/2000 | Pashley et al. |

(Continued)

FOREIGN PATENT DOCUMENTS

| | | |
|---|---|---|
| EP | 2381474 A2 | 10/2011 |
| JP | 2000-349346 | 12/2000 |

(Continued)

OTHER PUBLICATIONS

Kading, "Thermal conduction in metallized silicon-dioxide layers on silicon," Appl. Phys. Lett 65, 1994, pp. 1629-1631.

(Continued)

*Primary Examiner* — Whitney T Moore
(74) *Attorney, Agent, or Firm* — Kilpatrick Townsend & Stockton, LLP

(57) ABSTRACT

A substrate for an LED emitter includes a body with a recess region formed therein. Bonding pads are disposed within the recess region, including LED bonding pads for LEDs and supporting chip bonding pads for one or more semiconductor chips that provide supporting circuitry (e.g., driver and/or controller circuitry) to support operation of the LEDs. External electrical contacts can be disposed outside the recess region. Electrical paths, disposed at least partially within the body of the substrate, connect the external electrical contacts to a first subset of the supporting chip bonding pads and connect a second subset of the supporting chip bonding pads to the plurality of LED bonding pads such that one or more supporting chips connected to the controller pads can be operated to deliver different operating currents to different ones of the LEDs.

20 Claims, 11 Drawing Sheets

(51) Int. Cl.
*H01L 25/075* (2006.01)
*H05B 33/08* (2006.01)
(52) U.S. Cl.
CPC ............... *H01L 2924/0002* (2013.01); *H01L 2924/15174* (2013.01)

(56) References Cited

U.S. PATENT DOCUMENTS

| | | |
|---|---|---|
| 6,307,160 B1 | 10/2001 | Mei et al. |
| 6,351,069 B1 | 2/2002 | Lowery et al. |
| 6,495,964 B1 | 12/2002 | Muthu et al. |
| 6,608,332 B2 | 8/2003 | Shimizu et al. |
| 6,614,179 B1 | 9/2003 | Shimizu et al. |
| 6,642,652 B2 | 11/2003 | Collins, III et al. |
| 6,680,128 B2 | 1/2004 | Mei |
| 6,777,883 B2 | 8/2004 | Mukherjee |
| 6,791,116 B2 | 9/2004 | Takahashi et al. |
| 6,828,170 B2 | 12/2004 | Roberts et al. |
| 7,064,353 B2 | 6/2006 | Bhat |
| 7,139,125 B1 | 11/2006 | Mi |
| 7,156,538 B2 | 1/2007 | Han et al. |
| 7,157,744 B2 | 1/2007 | Palmteer et al. |
| 7,168,608 B2 | 1/2007 | Mei |
| 7,199,446 B1 | 4/2007 | Mei et al. |
| 7,230,222 B2 | 6/2007 | Cheng |
| 7,264,378 B2 | 9/2007 | Loh |
| 7,465,069 B2 | 12/2008 | Li |
| 7,473,933 B2 | 1/2009 | Yan |
| 7,670,872 B2 | 3/2010 | Yan |
| 7,772,609 B2 | 8/2010 | Yan |
| 8,013,533 B2 | 9/2011 | De Rijck et al. |
| 8,344,629 B2 | 1/2013 | Deixler |
| 8,384,097 B2 | 2/2013 | Yan |
| 8,598,793 B2 | 12/2013 | Yan et al. |
| 8,773,024 B2 | 7/2014 | Yan et al. |
| 2001/0015778 A1 | 8/2001 | Murade |
| 2002/0004251 A1 | 1/2002 | Roberts et al. |
| 2002/0015013 A1 | 2/2002 | Ragle |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1 | 6/2003 | Song et al. |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004437 A1 | 1/2004 | Shimizu et al. |
| 2004/0051111 A1 | 3/2004 | Ota et al. |
| 2004/0079957 A1 | 4/2004 | Andrews et al. |
| 2004/0087165 A1 | 5/2004 | Theiss et al. |
| 2004/0102061 A1 | 5/2004 | Watanabe |
| 2004/0114393 A1 | 6/2004 | Galli |
| 2004/0126918 A1 | 7/2004 | Kurahashi et al. |
| 2004/0150991 A1 | 8/2004 | Ouderkirk et al. |
| 2004/0173810 A1 | 9/2004 | Lin et al. |
| 2004/0201025 A1 | 10/2004 | Barnett |
| 2004/0208210 A1 | 10/2004 | Inoguchi |
| 2004/0257496 A1 | 12/2004 | Sonoda |
| 2005/0035364 A1 | 2/2005 | Sano et al. |
| 2005/0093146 A1 | 5/2005 | Sakano |
| 2005/0127281 A1 | 6/2005 | Zheng et al. |
| 2005/0128751 A1 | 6/2005 | Roberge |
| 2005/0145872 A1 | 7/2005 | Fang et al. |
| 2005/0162864 A1 | 7/2005 | Verdes |
| 2005/0179376 A1 | 8/2005 | Fung et al. |
| 2005/0199900 A1 | 9/2005 | Lin et al. |
| 2005/0224830 A1 | 10/2005 | Blonder et al. |
| 2005/0253242 A1 | 11/2005 | Costello et al. |
| 2005/0286131 A1 | 12/2005 | Saxena et al. |
| 2006/0002110 A1 | 1/2006 | Dowling et al. |
| 2006/0012299 A1 | 1/2006 | Suehiro et al. |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0091416 A1 | 5/2006 | Yan |
| 2006/0091788 A1 | 5/2006 | Yan |
| 2006/0097385 A1 | 5/2006 | Negley |
| 2006/0170332 A1 | 8/2006 | Tamaki et al. |
| 2006/0284209 A1 | 12/2006 | Kim et al. |
| 2007/0023769 A1 | 2/2007 | Nishimoto et al. |
| 2007/0081360 A1 | 4/2007 | Bailey et al. |
| 2007/0085103 A1 | 4/2007 | Nishioka et al. |
| 2007/0139437 A1 | 6/2007 | Boroson et al. |
| 2007/0170449 A1 | 7/2007 | Anandan |
| 2007/0194341 A1 | 8/2007 | Chang et al. |
| 2007/0241357 A1 | 10/2007 | Yan |
| 2008/0083931 A1 | 4/2008 | Bando et al. |
| 2008/0149962 A1 | 6/2008 | Kim |
| 2008/0278691 A1* | 11/2008 | Willemsen ......... G02B 27/0994 353/31 |
| 2008/0308825 A1 | 12/2008 | Chakraborty et al. |
| 2009/0316399 A1* | 12/2009 | Chang .................... H01L 33/58 362/235 |
| 2009/0316409 A1 | 12/2009 | Kim |
| 2010/0066255 A1 | 3/2010 | Roberts |
| 2010/0259930 A1 | 10/2010 | Yan |
| 2011/0012512 A1 | 1/2011 | Young et al. |
| 2011/0178582 A1 | 7/2011 | Dougal |
| 2011/0198653 A1 | 8/2011 | Cho |
| 2011/0248289 A1 | 10/2011 | Hsieh et al. |
| 2011/0291135 A1 | 12/2011 | Hsieh |
| 2012/0286669 A1 | 11/2012 | Yan et al. |
| 2012/0306370 A1 | 12/2012 | Van De Ven et al. |
| 2013/0026511 A1 | 1/2013 | Yeh et al. |
| 2014/0209939 A1 | 7/2014 | Yan et al. |
| 2015/0061508 A1 | 3/2015 | Yan et al. |
| 2015/0282260 A1* | 10/2015 | Hussell ............. H05B 33/0806 315/51 |

FOREIGN PATENT DOCUMENTS

| | | |
|---|---|---|
| JP | 2000-349347 | 12/2000 |
| JP | 2001-057445 | 2/2001 |
| JP | 2002-185046 | 6/2002 |
| JP | 2004-241704 | 8/2004 |
| JP | 2004-253404 | 9/2004 |
| KR | 10-2011-0118523 A | 10/2011 |
| KR | 10-2014-0121214 A | 10/2014 |

OTHER PUBLICATIONS

Yan, Xiantao, et al., "Two Test Specimens for Determining the Interfacial Fracture Toughness in Flip-Chip Assemblies," Transactions of the ASME, vol. 120, Jun. 1998, p. 150.

Yan, Xiantao, "Analysis Based Design Guidelines for Metal Runner and Passivation Layers in IC Packaging," Delphi Automotive Systems Analytical Engineering Conference, May 2000, p. 1.

"Solvent Soluble Polyimide with High Transparency and High Tg: HOP-400, 500", Hitachi Cable Review, Aug. 2003, No. 22, p. 78.

Office Action mailed Mar. 16, 2015 in U.S. Appl. No. 14/165,372, 6 pages.

Office Action mailed Nov. 20, 2015 in U.S. Appl. No. 14/231,406, 19 pages.

Notice of Allowance mailed Jan. 13, 2015 in U.S. Appl. No. 14/322,841, 9 pages.

International Search Report and Written Opinion mailed Feb. 29, 2016 in PCT/US2015/062760, 11 pages.

* cited by examiner

COMPACT EMITTER FOR WARM DIMMING AND COLOR TUNABLE LAMP

CROSS-REFERENCE TO RELATED APPLICATIONS

This application claims the benefit of U.S. Application No. 62/085,059, filed Nov. 26, 2014, the disclosure of which is incorporated herein by reference in its entirety.

BACKGROUND

The present disclosure relates generally to LED-based lighting devices and in particular to a compact emitter for a warm-dimming and color-tunable lamp.

An LED-based light source requires a number of components. At the core are one or more LEDs, where the term "LED" (or light-emitting diode) refers to a semiconductor die or chip that emits light (typically in a relatively narrow frequency band) in response to applied current, optionally including a coating of phosphor or other wavelength-shifting material applied to a surface of the die. In addition to the LEDs, the light source typically requires some sort of support structure to provide electrical connections to the LEDs as well as mechanical robustness. An encapsulating material is also used to provide protection from the elements while allowing light to escape. This encapsulating material typically incorporates a lens, diffuser, and/or other optical structures to shape the emitted light; it may also incorporate phosphors or other color-shifting material to modify the color of the emitted light. The term "emitter" is used herein to refer to the combination of the LED(s), support structures, and encapsulating materials that can function as a light source. One or more emitters can be incorporated into a lamp (e.g., a light bulb, light fixture, or the like).

For some applications, it is desirable to provide an LED-based light source that has controllably variable light output. For example, some LED light sources can incorporate LEDs that produce light with different wavelengths (e.g., warm white and cool white light, or light of different colors such as red, green, blue, amber, etc.), and it may be desirable to vary the color of light emitted from the light source by varying the relative current supplied to different LEDs and/or to vary the brightness by varying the total current. To support such operations, an LED-based light source can include additional components external to the emitter. For example, a controllable driver circuit can be used to supply the desired amount of current to different LEDs in order to provide a desired color, and to adjust the relative and/or total current to provide color tuning and dimming. Further, the LED-based light source may have characterization or calibration data (e.g., a mapping from a desired color to a distribution of source currents that produces the desired color) that needs to be stored in memory somewhere within the light source, e.g., in a PROM (programmable read-only memory) connected to the emitter.

SUMMARY

External components such as controllable driver circuits or circuit modules, calibration-data memories, and the like generally increase the cost of LED-based lighting devices. Further, such components can make the lighting device harder to work with. The external components add bulk that must be accommodated somewhere within the lighting device. For example, an external driver circuit generally needs to be connected to the emitter using wires or a cable (for present purposes, a cable can be viewed as a bundle of wires). This may necessitate attaching a connector or the like to the emitter, which can increase the size and manufacturing cost of the emitter. In addition, operating current is often supplied to LEDs using pulsed currents. Where multiple currents are being supplied through a single cable and connector, a time-varying current in one wire can have inductive effects on other wires, making it harder to precisely regulate the driving current. Time-varying currents in a cable running from an external driver circuit to the emitter can also result in electromagnetic interference with other devices.

In addition, for at least some types of LEDs, the color output can be affected by junction temperature, which can result in brightness changing as the device heats up during use. Further, different types of LEDs can be affected differently by operating temperature. Consequently, if an emitter includes multiple types of LEDs, the color may also shift as the LEDs heat up during use. Such effects can be controlled using a temperature sensor placed within or on the emitter. The temperature sensor can provide a temperature reading from which a junction temperature for the LEDs can be inferred. A controller for the driver circuit can use the temperature sensor readings to adjust the driving currents to reduce the effect of temperature on light output. However, use of a temperature sensor can require still more external wiring and control circuitry.

Certain embodiments of the present invention provide emitter structures that can incorporate various "supporting" circuitry such as driver circuits, control logic, memory, and/or temperature sensor directly into the emitter. For example, all of the supporting circuitry described above can be fabricated in a single semiconductor chip (referred to herein as a "controller/driver chip"), and the controller/driver chip, as a bare die or bump die, can be placed on the same ceramic substrate on which the LEDs are disposed. As another example, two (or more) semiconductor chips can be used, with one chip (referred to herein as a "microcontroller unit" or "MCU") incorporating control logic and memory and another chip (referred to herein as a "driver unit" or "driver chip") incorporating driver circuitry to generate operating current for the LEDs. Both chips can be placed on the same ceramic substrate on which the LEDs are disposed and connected to each other such that the driver unit operates in response to driver control signals from the MCU. Additional supporting chips can be used to provide temperature sensors and/or other sensors that may be desired. Electrical connections between the supporting chip(s) that provide control, driver, and other supporting circuitry and the LEDs can be fabricated on and/or within the emitter substrate, e.g., using metal traces and vias.

The same optical material used to encapsulate the LEDs (e.g., a primary lens) can also be used to encapsulate the supporting chip(s). Thus, a compact emitter is provided. Further, the number of external electrical connections to the emitter can be reduced. For instance, instead of requiring a separate external connection to supply current to each independently addressable group of LEDs, a single external power connection can be provided, since the driver chip (or the driver circuitry of a combined controller/driver chip) generates the operating currents within the emitter. Thus, in some embodiments, the number of external electrical connections to the emitter can be reduced to as few as two (power and ground). In some embodiments, additional external connections can be provided, e.g., input connections for calibration and/or control input signals (such as signals to control the color and/or brightness of the light).

In some embodiments, a substrate for an LED emitter includes a body with a recess region formed therein. Bonding pads are disposed within the recess region, including LED bonding pads to electrically connect to LEDs and supporting chip bonding pads to electrically connect to one or more supporting chips. External electrical contacts can be disposed outside the recess region. Electrical paths, disposed at least partially within the body of the substrate, connect the external electrical contacts to a first subset of the supporting chip bonding pads and connect a second subset of the supporting chip bonding pads to the LED bonding pads such that a supporting chip connected to the supporting chip bonding pads is operable to deliver different operating currents to different ones of the LEDs. For instance, the LEDs can be connected into two or more independently addressable groups (e.g., three groups, five groups, seven groups, or any other number), and each group can be connected to receive current via a different one of the supporting chip bonding pads.

To form an emitter, LEDs can be disposed in the recess region of the substrate and connected to the LED bonding pads. A controller/driver chip can be disposed in the recess region and connected to the supporting chip bonding pads (e.g., by flip-chip bonding). An optically transparent cover (including, e.g., a primary lens, flat-top cover, or color mixing rod) can be disposed over the recess region. The optically transparent cover can be sealed to the body to protect the semiconductor devices (LEDs and supporting chip(s)) from the elements.

In other embodiments, a substrate for an LED emitter includes a body with a recess region formed therein. Bonding pads are disposed within the recess region, including LED bonding pads to electrically connect to LEDs, microcontroller unit bonding pads to electrically connect to a microcontroller unit (which can be a bare die or bump die semiconductor chip), and driver unit bonding pads to electrically connect to a driver unit (which can be a bare die or bump die semiconductor chip). External electrical contacts can be disposed outside the recess region. Electrical paths, disposed at least partially within the body of the substrate, connect the external electrical contacts to a first subset of the microcontroller unit bonding pads, connect a second subset of the microcontroller unit bonding pads to a first subset of the driver unit bonding pads, and connect a second subset of the driver unit bonding pads to the LED bonding pads such that a driver unit connected to the driver unit bonding pads is operable to deliver different operating currents to different ones of the LEDs in response to control signals received from the microcontroller unit. For instance, the LEDs can be connected into two or more independently addressable groups (e.g., three groups, five groups, seven groups, or any other number), and each group can be connected to receive current via a different one of the driver unit bonding pads.

To form an emitter, LEDs can be disposed in the recess region of the substrate and connected to the LED bonding pads. A microcontroller unit can be disposed in the recess region and connected to the microcontroller unit bonding pads (e.g., by flip-chip bonding). A driver unit can be disposed in the recess region and connected to the driver unit bonding pads (e.g., by flip-chip bonding). An optically transparent cover (including, e.g., a primary lens, flat-top cover, or color mixing rod) can be disposed over the recess region. The optically transparent cover can be sealed to the body of the substrate to protect the semiconductor devices (LEDs and supporting chips, including the microcontroller unit and the driver unit) from the elements.

The following detailed description together with the accompanying drawings will provide a better understanding of the nature and advantages of the present invention.

DETAILED DESCRIPTION

Figure 1:
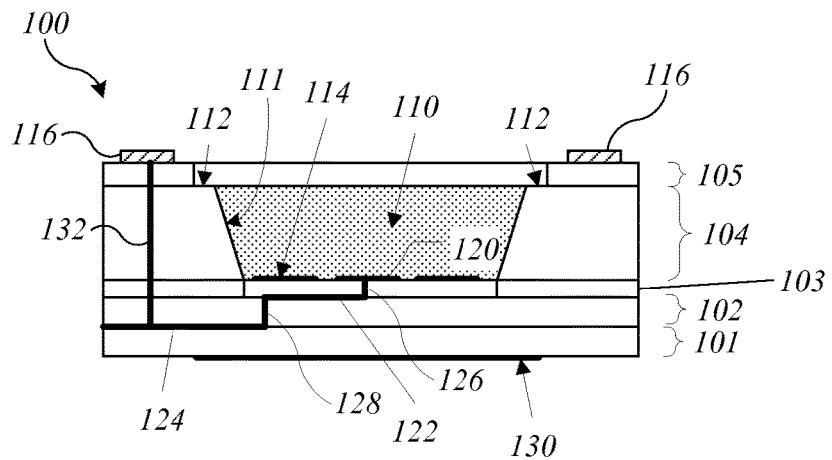
FIG. 1 is a simplified side view of a substrate for an LED package according to an embodiment of the present invention.

FIG. 1 is a simplified side view of a substrate 100 for an LED package according to an embodiment of the present invention. Substrate 100 is formed as a series of layers 101-105 of a ceramic material (e.g., alumina or aluminum nitride (AlN)). Layers 101-105 have different thicknesses that can be optimized to control thermal expansion and thermal stress. For example, layers 101 and 102 can be 0.15 millimeters (mm) each, layer 103 can be 0.10 mm, layer 104 can be 0.50 mm, and layer 105 can be 0.15 mm, for a total thickness of 1.05 mm.

Upper layers 104 and 105 define a recess (or recess region) 110 within which one or more LEDs (not shown) can be placed. In one embodiment, recess 110 has the shape of a truncated cone; sidewall 111 is circular and slanted inward, e.g., at an angle of about 20° with respect to the vertical axis. Sidewall 111 of recess 110 can be coated with a reflective material (e.g., silver) to increase light output of the device.

Upper layer 105 can provide a circular opening, allowing light to escape from recess 110. In this embodiment, the edge of layer 105 is set back from the edge of layer 104 at the periphery of recess 110, thereby forming a ledge 112 upon which a primary lens can be placed.

Layers 101-103 provide a base for the package. A patterned metal layer 114 is deposited on top-most base layer 103 within recess 110. Patterned metal layer 114 provides various bond pads (e.g., pad 120) for electrical contacts to LEDs and supporting circuitry disposed within recess 110. (These are referred to herein as "top-side" bond pads because they are on the topmost one of the base layers.) Specific examples are described below, but it will be appreciated that the present invention is not limited to any particular configuration of bond pads or of metal layer 114.

External electrical contacts 116 are provided on the top surface near the peripheral edge of substrate 100. In some embodiments, some or all of external electrical contacts 116 can be formed at the peripheral edge of substrate 100 and can include metal coatings that extend vertically along the entire thickness of substrate 100 (or a portion thereof). Any number of external electrical contacts 116 can be provided on top and/or on the peripheral edge of substrate 100. Each top-side bond pad (e.g., pad 120) of patterned metal layer 114 can be connected to one (or more) of external electrical contacts 116, e.g., using metal lines disposed between ceramic layers and metal vias passing through the ceramic layers. By way of illustration, FIG. 1 shows top-side bond pad 120 connected to external contact 116 by interlayer metal lines 122, 124 and vias 126, 128, 132. Any configuration of connections may be used, and the number of base layers can be increased or decreased to accommodate the connections. Further, in some embodiments, some of the top-side bond pads (e.g., pad 120) can be connected to each other by interlayer metal lines and vias that do not connect to external electrical contacts 116. In some embodiments, the electrical connections are arranged such that power can be supplied separately to different LEDs or groups of LEDs. In some embodiments, external contacts may also be disposed on the bottom and/or side surfaces of substrate 100 in addition to or instead of the top surface.

As described below, a controller/driver chip can also be disposed within recess 110, e.g., next to the LEDs. In some embodiments, external electrical contacts 116 can connect to the controller/driver chip via internal electrical paths (e.g., metal lines and vias as described) to provide power, and additional internal electrical paths (e.g., additional metal lines and vias) can provide operating current from the controller/driver chip to the LEDs. Where the electrical connections are arranged such that power can be supplied separately to different LEDs or groups of LEDs, the controller/driver chip can be connected to separately provide an operating current to each independently addressable LED or group of LEDs. In some embodiments, instead of a single supporting chip that includes both control logic and driver circuitry, two or more supporting chips can be used, with each supporting chip implementing at least part of the control logic and/or driver circuitry that supports operation of the LEDs.

A metal plate 130 can be disposed on the bottom surface of bottom layer 101. Metal plate 130, which is advantageously circular and as large as possible in some embodiments, provides a metallic surface for attaching a heat sink. Metal plate 130 can be electrically isolated from the various electrical paths and pads that may be present on, within, and/or under substrate 100.

Figure 2:
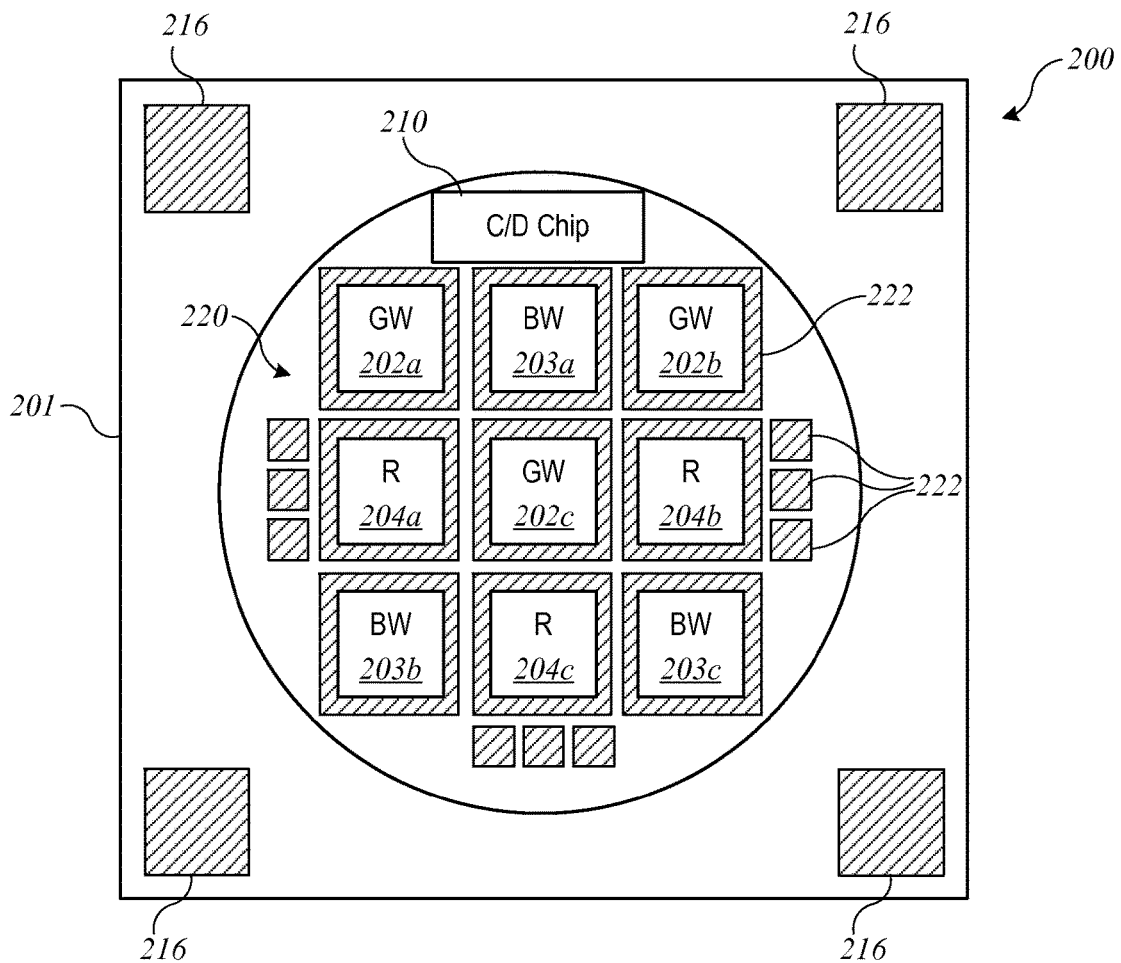
FIG. 2 is a simplified top view of an emitter according to an embodiment of the present invention.

As noted above, substrate 100 can be used to support any number and arrangement of LEDs and supporting chip(s). FIG. 2 is a simplified top view of an emitter 200 according to an embodiment of the present invention. Emitter 200 can include a substrate 201, which can be generally similar to substrate 100 described above. Substrate 201 can provide external electrical contacts 216, which can be similar to contacts 116 described above.

Substrate 201 can include a recess region 220, in which are disposed nine LEDs 202a-c, 203a-c, 204a-c and controller/driver ("C/D") chip 210, which is an example of a supporting chip. While nine LEDs are shown, it will become apparent that the number of LEDs can be varied.

In this description, the term "LED" is used to refer to a semiconductor device that produces light in response to current. The device may in some instances be coated with a phosphor or similar material to shift the wavelength of the light produced. However, the LED as such is not otherwise encapsulated or protected from the elements. Such protection is provided by package structures described herein, including the emitter substrate and overlying optical structures.

LEDs 202, 203, 204 can be connected to electrical pads 222 (only some of which are shown) to supply operating current. Flip-chip and/or wire bonding can be used to make the connections. In this example, LEDs 202a-c are greenish white (GW) LEDs that produce a greenish white light. LEDs 203a-c are bluish white (BW) LEDs that produce a bluish white light, and LEDs 204a-c are red LEDs that produce red light. Using metal paths and vias as described above, LEDs 202a-c can be electrically connected in series, LEDs 203a-c can be electrically connected in series, and LEDs 204a-c can be electrically connected in series. In this manner, three independently addressable groups of LEDs can be provided. By adjusting the relative current supplied to each group, the color of light produced by emitter 200 can be tuned to a desired color.

Controller/driver chip 210 can be a semiconductor integrated circuit chip (bare die or bump die) with multiple external electrical contacts. In some embodiments, controller/driver chip 210 can include input contact pads for power, ground, and a control input signal, and output contact pads to deliver the operating currents to LEDs 202, 203, 204 (e.g., one output pad per group, with all groups coupled to a common ground pad). Controller/driver chip 210 can incorporate control logic to determine operating currents based on the control input signal as well as current-generating (driver) circuitry. In some embodiments, controller/driver chip 210 can implement control logic and algorithms similar to those described in U.S. patent application Ser. No. 14/244,787, filed Apr. 3, 2014 (published as U.S. Patent App. Pub. No. 2014/0300283), the disclosure of which is incorporated by reference herein. The specific design and operation of controller/driver chip 210 is not critical to understanding the present invention, and a detailed description is omitted. For present purposes, it is sufficient to understand that controller/driver chip 210 can be provided as an unpackaged (bare die or bump die) semiconductor chip with various distinct electrical contact regions (e.g., bond pads or bumps) disposed on one or more surfaces. These contact regions can be electrically connected to bond pads on the top surface of recess region 220 (e.g., using flip-chip bonding techniques), thereby electrically connecting controller/driver chip 210 between external input signals (e.g., signals received from outside emitter 200 via external electrical contacts 216) and LEDs 202, 203, 204, such that, in response to the external input signals, controller/driver chip 210 can provide a first operating current to LEDs 202, a second operating current to LEDs 203, and a third operating current to LEDs 204. The three operating currents can be independently adjusted in order to tune the light to a desired color.

In the example shown, controller/driver chip 210 is positioned at the periphery of recess region 220. This can facilitate electrical connection while minimally affecting the area available for placing LEDs. In addition, placing controller/driver chip 210 within recess region 220 can facilitate protecting controller/driver chip 210 from the elements. For example, as described below, recess region 220 can be covered by an optical structure, such as a primary lens, and the optical structure can be sealed in place over recess region 220, thereby protecting LEDs 202, 203, 204 and controller/driver chip 210 from the elements.

It will be appreciated that emitter 200 is illustrative and that variations and modifications are possible. For example the number of LEDs and/or the number of independently addressable groups of LEDs can be varied as desired. Thus, there can be two groups, three groups, or more groups (e.g., five or seven groups) of LEDs, and each group can include one or more LEDs, two or more LEDs, or any number of LEDs. The number of LEDs in each group can be the same or different as desired. The type and color of LEDs in different groups can also be varied. The size, shape, and position of the controller/driver chip can also be varied, e.g., placing controller/driver chip 210 elsewhere within recess region 220, or outside recess region 220 but still on substrate 201. Further, rather than a single controller/driver chip, multiple supporting chips (e.g., separate controller and driver units) can be used; examples are described below.

Figure 3:
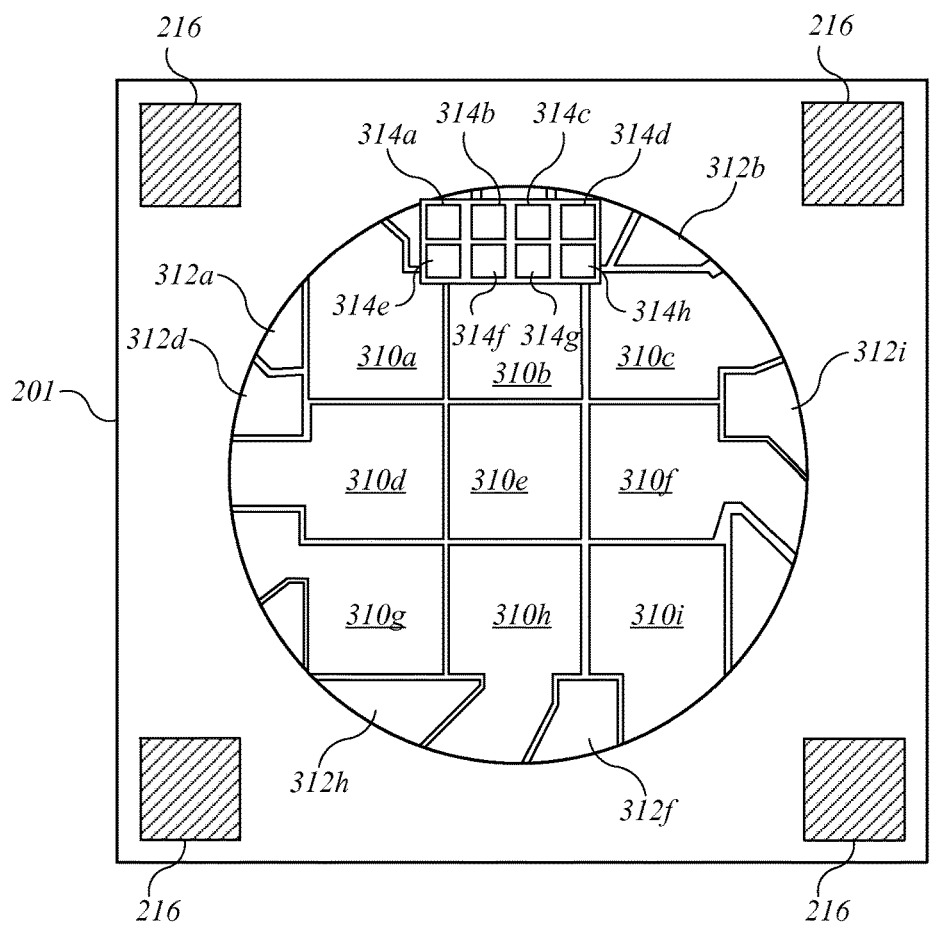
FIG. 3 shows further detail of top-side bond pads for a nine-LED configuration according to an embodiment of the present invention.

FIG. 3 shows further detail of top-side bond pads for a nine-LED configuration according to an embodiment of the present invention. Substrate 201 can be as described above. Shown in FIG. 3 are bond pads 310a-i, 312a-i, and 314a-h. Bond pads 310a-i can be sized and positioned such that an LED can be mounted directly on each bond pad. In some embodiments, bond pads 310a-i are made as large as possible, given overall size constraints and the need to maintain electrical isolation between them, in order to facilitate heat dissipation. Bond pads 312a, 312b, 312d, 312f, 312h, 312i can be smaller pads that can be used to attach wire bonds from various LEDs. These aspects can be similar to embodiments described in U.S. Pat. No. 8,384,097, the disclosure of which is incorporated by reference herein.

Bond pads 314a-h can be provided to connect to controller/driver chip 210 described above. In this example, eight pads arranged in two rows are used, although it is to be understood that the number and arrangement of pads can be varied. Further, in this example, it is assumed that controller/driver chip 210 can be flip-chip bonded onto pads 314a-h. In other embodiments, wire bonding may be used, and bond pads 314a-h may be arranged differently to facilitate wire bonding. In this manner, a controller/driver chip can be accommodated together with the LEDs in the recess region.

Some of bond pads 314 can be connected to LED bond pads 310, 312 using interlayer metal paths and vias, e.g., as described above with reference to FIG. 1. Others of bond pads 314 can be connected to external electrical contacts 216 using additional interlayer metal paths and vias. Thus, in operation, controller/driver chip 210 can receive power and a control signal via external electrical contacts 216 and can deliver operating current to the LEDs in response to the control signal.

Figure 4:
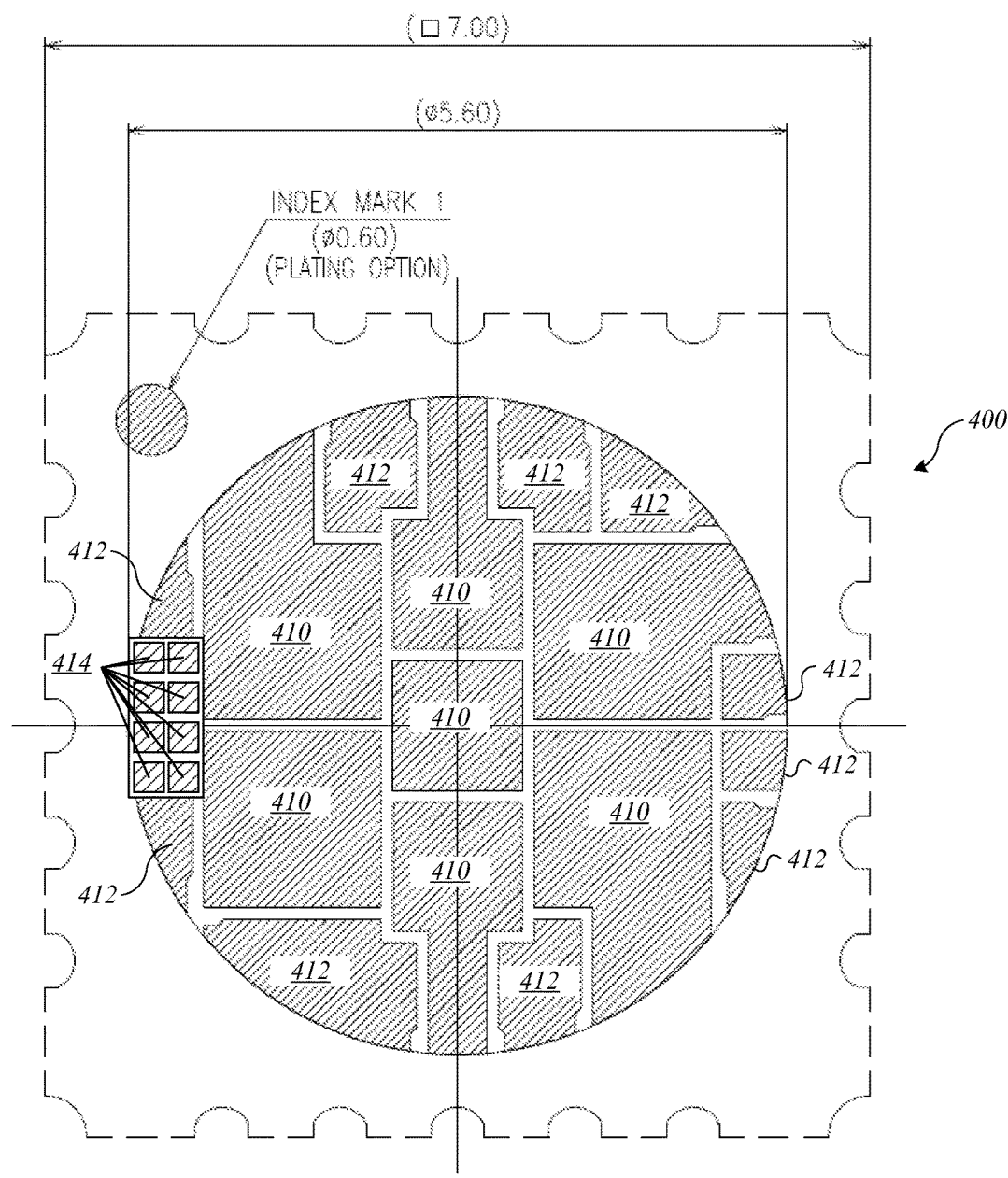
FIG. 4 shows another arrangement of top-side bond pads according to an embodiment of the present invention.

FIG. 4 shows another arrangement of top-side bond pads according to an embodiment of the present invention. Substrate 400 can be similar to substrates described above. In this example, seven LED bond pads 410 and seven peripheral bond pads 412 can be provided. Each LED can be a different color and can be independently supplied with operating current. (A "group" in this example includes just one LED.) Bond pads 414 can be provided to accommodate a controller/driver chip similar to controller/driver chip 210 described above. Again, the configuration shown can be used for flip-chip bonding; alternative configurations can support wire bonding.

Figure 5:
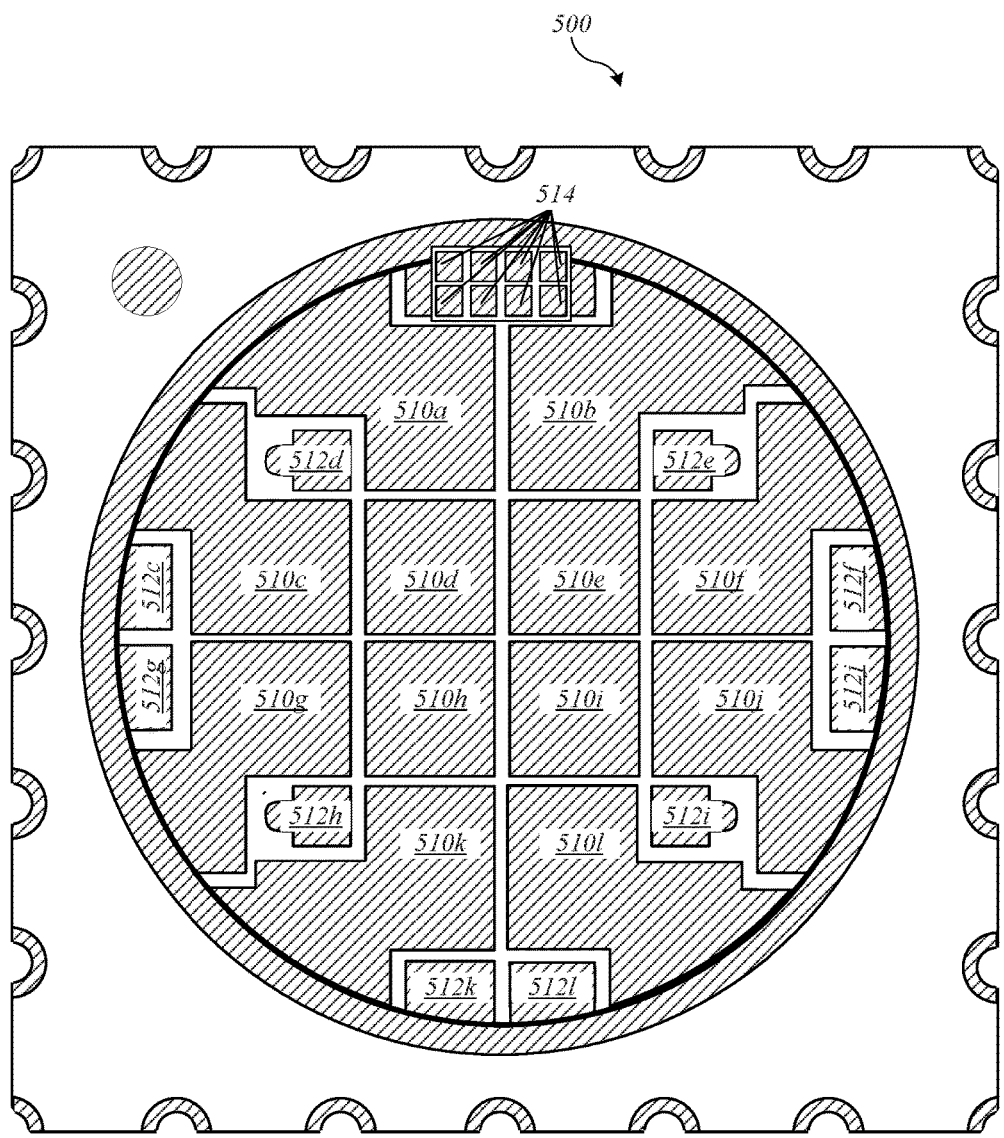
FIG. 5 shows another arrangement of top-side bond pads according to an embodiment of the present invention.

FIG. 5 shows yet another arrangement of top-side bond pads according to an embodiment of the present invention. Substrate 500 can be similar to substrates described above. In this example twelve LED bond pads 510a-l and twelve peripheral bond pads 512a-l can be provided. Bond pads 514 can be provided to accommodate a controller/driver chip similar to controller/driver chip 210 described above. Again, the configuration shown can be used for flip-chip bonding; alternative configurations can support wire bonding.

Those skilled in the art will appreciate that the pad arrangements are illustrative and that variations and modifications are possible. The number of bond pads provided for the controller/driver chip can depend on the particular configuration of the controller/driver chip, the number of output currents to be delivered, and the number of input pads used to supply power and control signals. Further, as described below, in some embodiments the controller/driver chip can be replaced with two (or more) supporting chips to provide control logic and operating current.

Multilayer ceramic substrates having internal metal paths and vias can be formed using known techniques, e.g., as described in above-referenced U.S. Pat. No. 8,384,097. After fabricating the substrate, the LEDs can be flip-chip bonded and/or wire bonded to the appropriate bonding pads, and the controller/driver chip (or multiple supporting chips) can also be flip-chip bonded and/or wire bonded to the appropriate bonding pads. Thereafter, the recess region can be filled with an optically transparent adhesive material and covered with an optically transparent cover. The optically transparent cover can take various forms, including a flat-top cover, a spherical or aspheric primary lens, or a color mixing rod. In addition to allowing light to exit and providing desired optical properties, the cover can provide protection from the elements for the semiconductor devices (including the LEDs and supporting chip(s)) disposed within the recess region.

Figure 6:
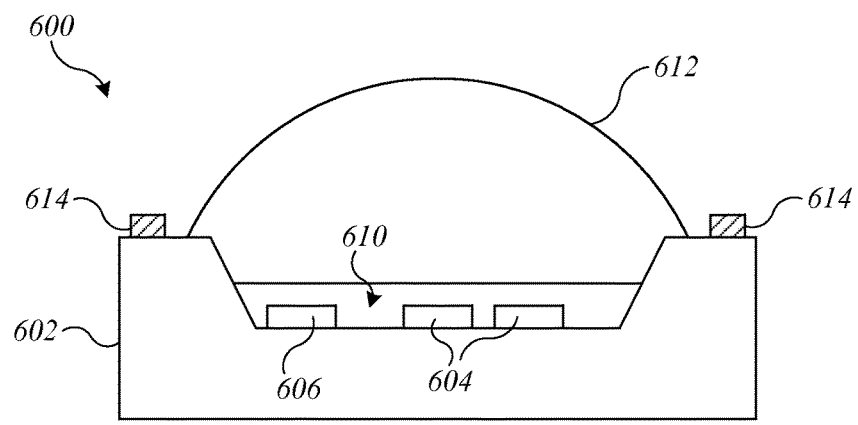
FIG. 6 shows a simplified cross-sectional view of an emitter according to an embodiment of the present invention.

FIG. 6 shows a simplified cross-sectional view of an emitter 600 according to an embodiment of the present invention. Emitter 600 includes substrate 602 (which can be similar to any of the substrates described above), on which are disposed LEDs 604 and controller/driver chip 606 (e.g., as described above). Recess region 610 can be filled with an optically transparent material, which can be an adhesive material, and capped with primary lens 612. External electrical contacts 614 are exposed, but LEDs 604 and controller/driver chip 606 can be sealed away from the elements by sealing primary lens 612 to substrate 602. As noted above, primary lens 612 can be replaced with other structures, such as a flat optically transparent cover or a color mixing rod. Further, the number and arrangement of LEDs and external contacts, and the location of the controller/driver chip, can be modified as desired.

Figure 7A:
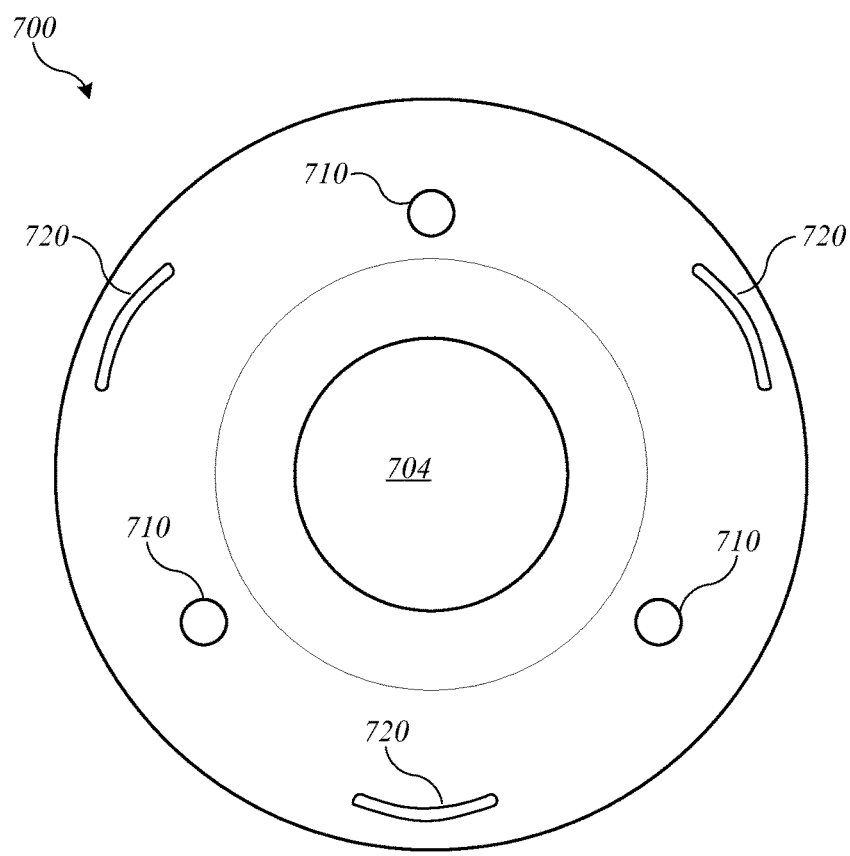
FIGS. 7A-7C show an example of a plastic cover according to an embodiment of the present invention.
Figure 7B:
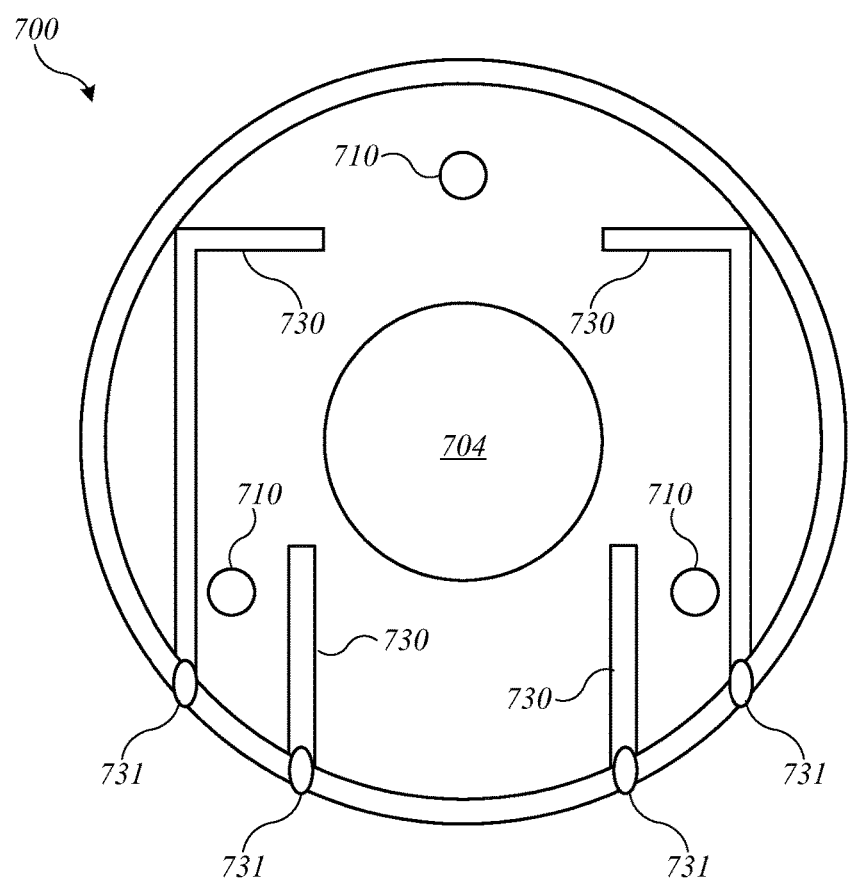
Figure 7C:
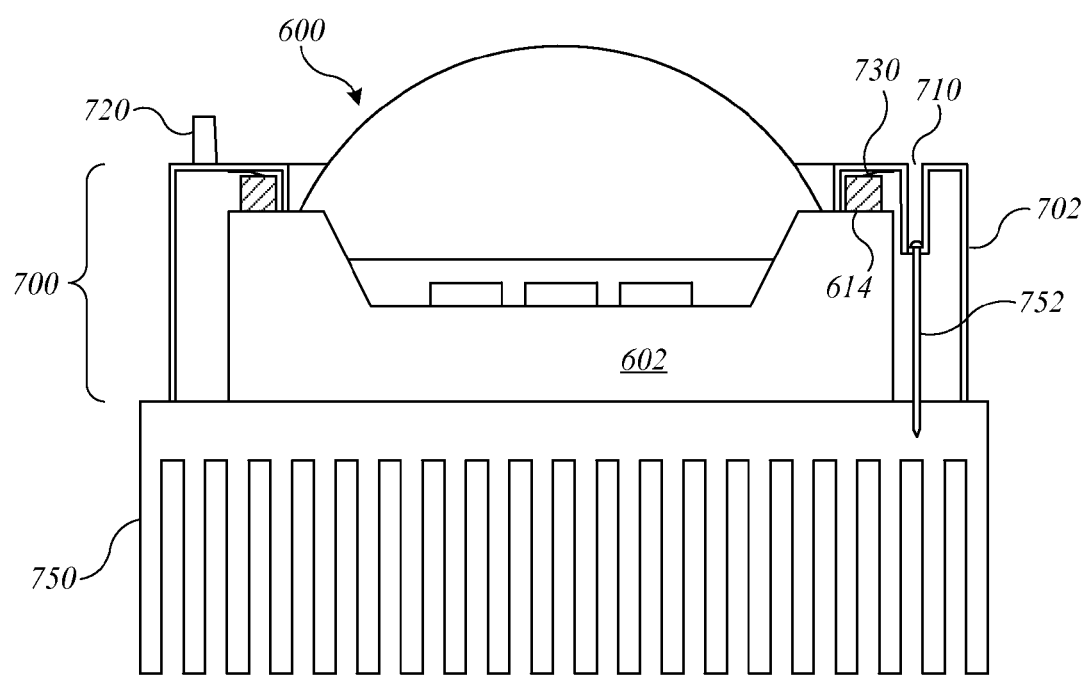

In some embodiments, a plastic cover can be placed over emitter 600 in order to facilitate electrical connections to external contacts (e.g., contacts 614 of FIG. 6) and to provide additional protection for the emitter substrate. FIGS. 7A-7C show an example of a cover 700 according to an embodiment of the present invention. FIG. 7A is a simplified top view; FIG. 7B is a simplified bottom view; and FIG. 7C is a simplified cross-section view showing cover 700 covering emitter 600 of FIG. 6 and further attached to a heat sink 750.

Cover 700, which can be made of plastic or other electrically insulating material, can be circular and can have a peripheral sidewall 702 (shown in FIG. 7C) that extends to cover the sides of substrate 602 of emitter 600. Cover 700 can also have a central opening 704 through which primary lens 612 can extend. (It should be noted that central opening 704 can also be provided even if the top surface of emitter 600 is flat, thus allowing light from the LEDs to pass through cover 700). Alignment and mounting holes 710 can be provided to facilitate connecting cover 700 to another structure, such as heat sink 750 (shown in FIG. 7C). In some embodiments, holes 710 can be arranged such that they are outside the peripheral edge of emitter 600. Additional alignment structures 720 can be provided, e.g. extending upward from the top surface of cover 700.

As shown in FIG. 7B, the underside of cover 700 can hold metal leads 730. Metal leads 730 can be connected to external fittings 731 (or to a single multi-pin connector) at the periphery of cover 700 to provide external electrical contacts. The internal ends of metal leads 730 can be bent downward, e.g., shown in FIG. 7C, to provide a spring-force contact with external electrical contacts 614 of emitter 600. When cover 700 is secured into place over emitter 600, contact with external electrical contacts 614 deflects metal leads 730 upward, and the spring force keeps metal leads 730 in contact with electrical contacts 614.

In some embodiments, emitter 600 can be directly connected to a heat sink such as heat sink 750 shown in FIG. 7C. As described above with reference to FIG. 1, the bottom surface of substrate 602 can have a metal plate disposed thereon to facilitate heat transfer. Securing emitter 600 to heat sink 750 can be accomplished using screws 752 or other fasteners through mounting and alignment holes 710 in cover 700. Thermally conductive adhesives, solder, or the like can also be used to secure emitter 600 to heat sink 750, in which case screws 752 can still be used to secure cover 700 in place. During operation, heat is transferred away from the LEDs and supporting chips to heat sink 750 through the thermally conductive material (e.g., ceramic and metal) of substrate 602; heat sink 750 dissipates the heat. In some embodiments, bonding pads can be made as large as possible (subject to constraints on available area and the need for electrical isolation between adjacent bonding pads) in order to facilitate heat transfer away from the LEDs and supporting chips.

It will be appreciated that cover 700 is illustrative and that variations and modifications are possible. The particular size and shape, as well as any alignment and mounting structures, can be varied as desired. The number and arrangement of metal leads and external fittings (or connectors) can also be modified.

Figure 8:
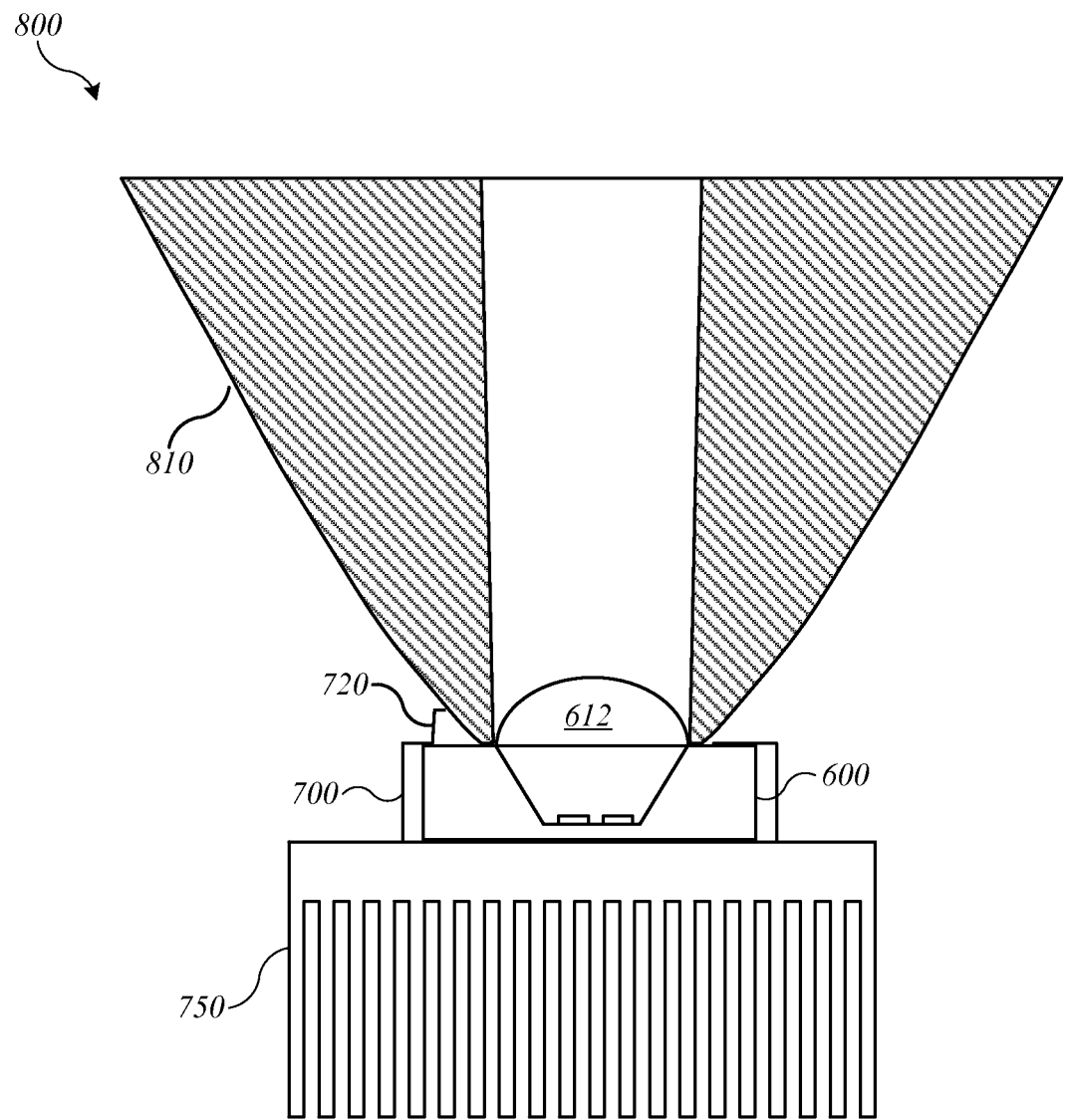
FIG. 8 shows a simplified cross-section view of a light device assembly according to an embodiment of the present invention.

FIG. 8 shows a simplified cross-section view of a light device assembly 800 according to an embodiment of the present invention. Assembly 800 includes emitter 600, cover 700, and heat sink 750 with the further addition of a secondary lens 810. Secondary lens 810 can be, for example a total internal reflection (TIR) lens that provides additional color mixing and shaping of the output light. In some embodiments, alignment structures 720 can be used to hold and align secondary lens 810. Other secondary optics can be substituted for secondary lens 810. For example, a parabolic reflector or the like can be used in addition to or instead of a TIR lens. Another example can be a "bulb" lens that distributes the light across a wider angle (e.g., approaching 360 degrees) to emulate the light output pattern of traditional incandescent bulbs. Different combinations of primary optics (e.g., lens 612 or an alternative structure) and secondary optics (e.g., lens 810 or an alternative structure) can be used. For example, a spherical or aspheric primary lens (e.g., lens 612) can be used in connection with a reflector or TIR lens (e.g., lens 810) to provide directional light. As another example, primary lens 612 can be replaced with a color mixing rod while TIR lens 810 or a reflector is used for the secondary optics. As yet another example, primary lens 612 can be replaced with a color mixing rod, and TIR lens 810 can be replaced with a secondary bulb lens or the like to distribute the light across a wide angle.

It should be noted that in the embodiments shown FIGS. 7C and 8, the only external electrical connections required are for power and a control signal, regardless of the number of independently addressable LED groups. This can simplify the incorporation of emitter 600 or assembly 800 into a light fixture.

In the embodiments described above, it is generally assumed that a single supporting chip includes both current generator (or driver) circuitry and control logic to control the driver circuitry. In other embodiments, the driver circuitry and the control logic can be implemented using separate supporting chips, both of which can be disposed within the recess region of the substrate and therefore internal to the emitter.

Figure 9:
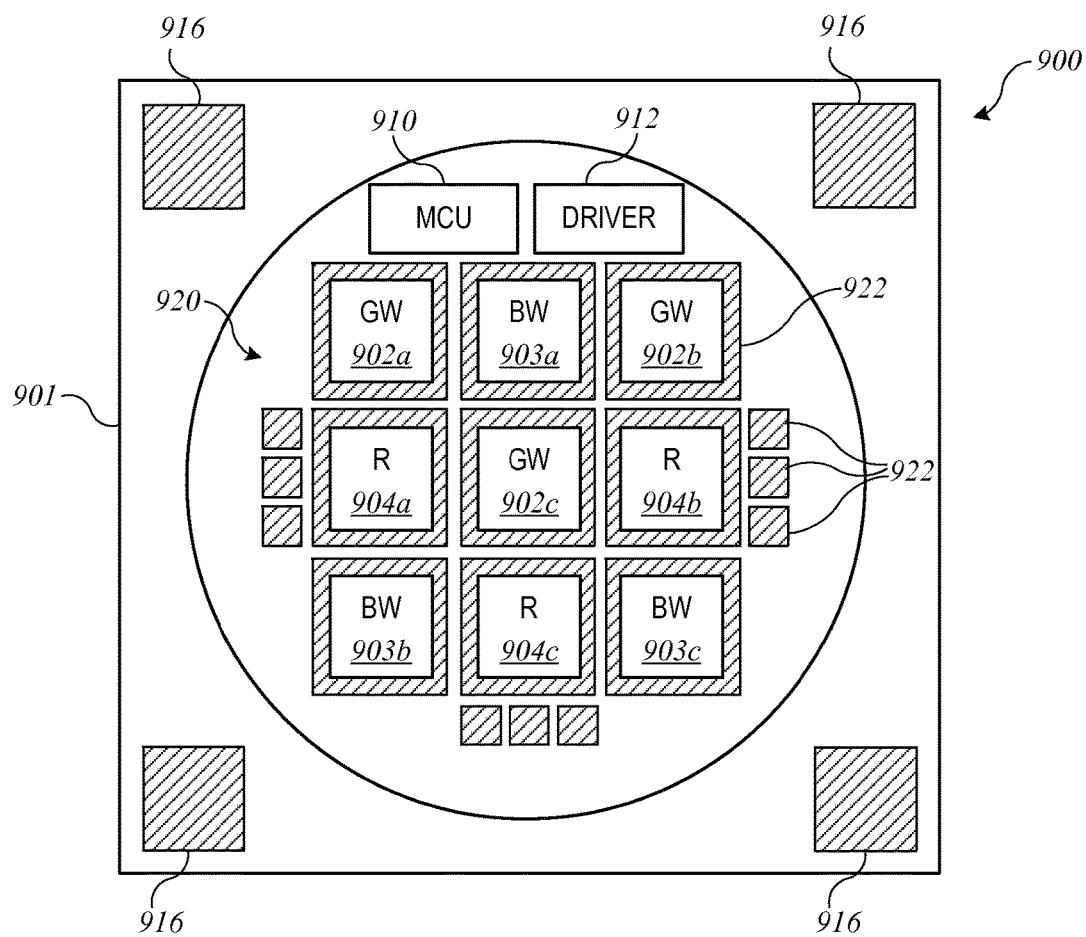
FIG. 9 shows a simplified top view of an emitter according to another embodiment of the present invention.

FIG. 9 shows a simplified top view of an emitter 900 according to an embodiment of the present invention that provides a microcontroller unit and a driver unit as separate semiconductor integrated circuit chips. Emitter 900 can be similar to emitter 200 described above. For example, emitter 900 can include a substrate 901, which can be generally similar to substrate 100 described above. Substrate 901 can provide external electrical contacts 916, which can be similar to contacts 116 described above.

Substrate 901 can include a recess region 920, in which are disposed nine LEDs 902a-c, 903a-c, 904a-c, and two supporting chips: microcontroller unit ("MCU") 910, and driver chip (or driver unit) 912.

LEDs 902, 903, 904 can be connected to electrical pads 922 (only some of which are shown) to supply operating current. Flip-chip and/or wire bonding can be used to make the connections. In this example, as in emitter 200 of FIG. 2, LEDs 902a-c are greenish white (GW) LEDs that produce a greenish white light. LEDs 903a-c are bluish white (BW) LEDs that produce a bluish white light, and LEDs 904a-c are red LEDs that produce red light. Using metal paths and vias as described above, LEDs 902a-c can be electrically connected in series, LEDs 903a-c can be electrically connected in series, and LEDs 904a-c can be electrically connected in series. In this manner, three independently addressable groups of LEDs can be provided. By adjusting the relative current supplied to each group, the color of light produced by emitter 900 can be tuned to a desired color.

MCU 910 can be a semiconductor integrated circuit chip (bare die or bump die) with multiple external electrical contacts. In some embodiments, MCU 910 can include input contact pads for power, ground, and one or more input control signals (e.g., control signals received from outside emitter 900), and output contact pads to provide driver control signals to driver chip 912. MCU 910 can incorporate control logic to determine a desired operating current for each independently addressable group of LEDs based on the input control signal(s) and to generate driver control signals based on the desired operating current. In some embodiments, MCU 910 can implement control logic and algorithms similar to those described in above-referenced U.S. patent application Ser. No. 14/244,787.

Driver chip 912 can be another semiconductor integrated circuit chip (bare die or bump die) with multiple external electrical contacts. In some embodiments, driver chip 912 can include input contact pads to receive the driver control signals from MCU 910 and output contact pads to provide a separate driving current to each group of LEDs 902, 903, 904. For instance, there can be one output pad per group, with all groups coupled to a common ground pad. Driver chip 912 can incorporate current-generating circuitry to independently generate an operating current for each group of LEDs based on control signals received from MCU 910. In some embodiments, driver chip 912 can implement control logic and algorithms similar to those described in above-referenced U.S. patent application Ser. No. 14/244,787.

The specific design and operation of MCU 910 and driver chip 912 is not critical to understanding the present invention, and a detailed description is omitted. For present purposes, it is sufficient to understand that MCU 910 and driver chip 912 can each be provided as an unpackaged (bare die or bump die) semiconductor chip with various distinct electrical contact regions (e.g., bond pads or bumps) disposed on one or more surfaces. These contact regions can be electrically connected to bond pads on the top surface of recess region 920, thereby electrically connecting MCU 910 between external input signals (e.g., signals received via external electrical contacts 916) and driver chip 912 and further electrically connecting driver chip 912 between MCU 910 and LEDs 902, 903, 904 such that, in response to the external input signals, MCU 910 can control driver chip 912 to provide a first operating current to LEDs 902, a second operating current to LEDs 903, and a third operating current to LEDs 904. The three operating currents can be independently adjusted in order to tune the light to a desired color.

In the example shown, MCU 910 and driver chip 912 are positioned at the periphery of recess region 920. This can facilitate electrical connection while minimally affecting the area available for placing LEDs. Further, referring to FIG. 1, the portion of topmost base layer 103 that underlies upper layer 104 can be patterned with metal traces to connect MCU 910 and driver chip 912. Placing MCU 910 and driver chip 912 within recess region 920 can facilitate protecting MCU 910 and driver chip 912 from the elements. For example, as described above, recess region 920 can be covered by an optical structure, such as a primary lens, and the optical structure can be sealed in place over recess region 920, thereby protecting LEDs 902, 903, 904, MCU 910, and driver chip 912 from the elements.

It will be appreciated that emitter 900 is illustrative and that variations and modifications are possible. For example the number of LEDs and/or the number of independently addressable groups of LEDs can be varied as desired. Thus, there can be two groups, three groups, or more groups (e.g., five or seven groups) of LEDs, and each group can include one or more LEDs, two or more LEDs, or any number of LEDs. The number of LEDs in each group can be the same or different as desired. The type and color of LEDs in different groups can also be varied. The size, shape, and position of the MCU and/or driver chip can also be varied. For instance, either or both of MCU 910 or driver chip 912 can be placed elsewhere within recess region 920, or outside recess region 920 but still on substrate 901. No particular physical proximity or distance between MCU 910 and driver chip 912 is required. Further, in some embodiments, there may be multiple driver chips controlled by a single MCU. For instance, a driver chip may be designed to provide up to four independently-controllable output currents; if there are more than four groups, one or more additional driver chips can be used (or a single driver chip with a larger number of output currents can be used). Each independently-controllable output current may be referred to as a "channel" of the driver chip.

Figure 10:
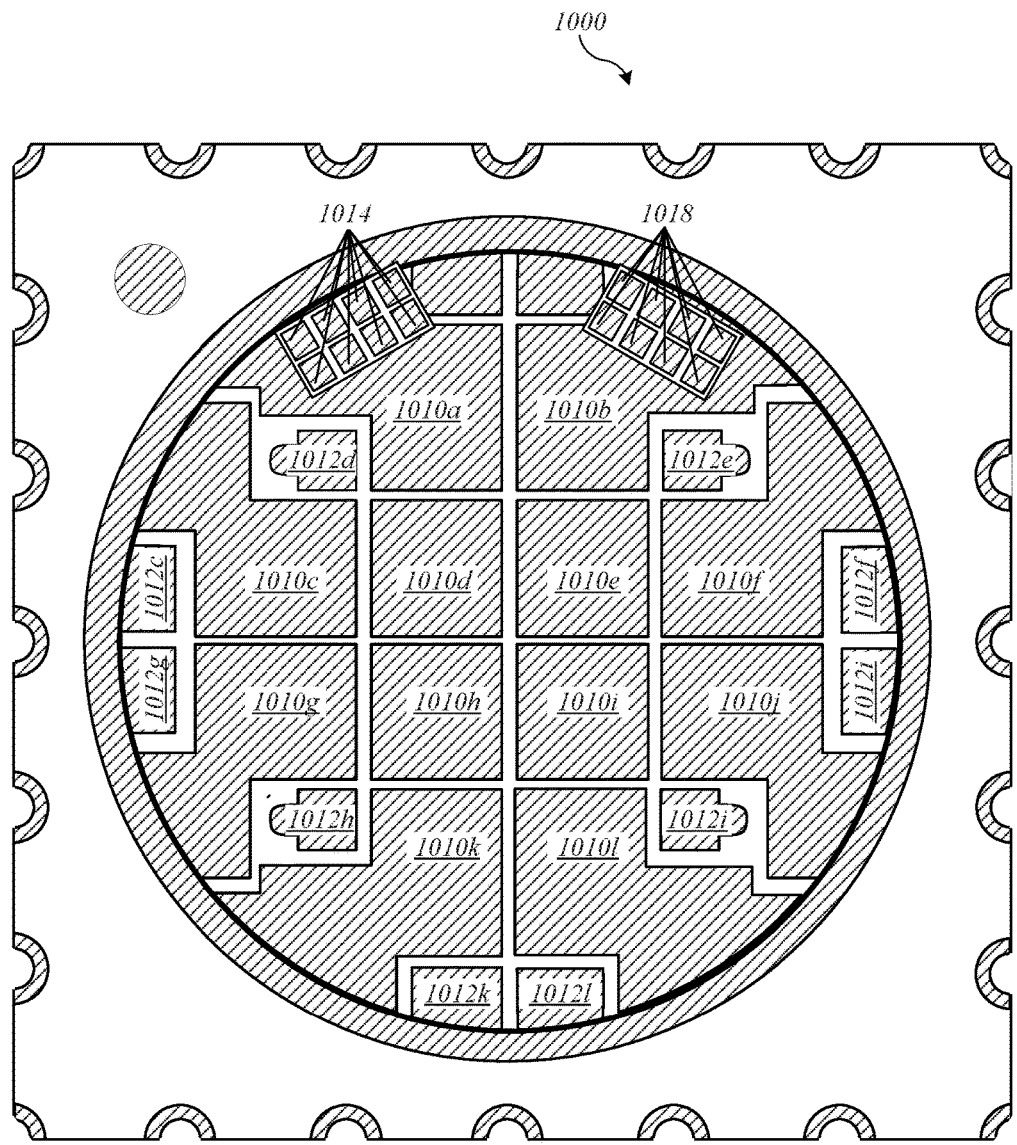
FIG. 10 shows another arrangement of top-side bond pads according to another embodiment of the present invention.

FIG. 10 shows another arrangement of top-side bond pads according to an embodiment of the present invention that provides a microcontroller unit and a driver unit (or driver chip) as separate semiconductor devices. Similarly to embodiments described above, the microcontroller unit and the driver are each provided as a bare die or bump die that can be placed on the same ceramic substrate on which the LEDs are disposed.

Substrate 1000 can be similar to substrates described above. In this example twelve LED bond pads 1010*a-l* and twelve peripheral bond pads 1012*a-l* can be provided. Bond pads 1014 can be provided to accommodate a microcontroller unit similar to MCU 910 described above, and bond pads 1018 can be provided to accommodate a driver chip similar to driver chip 912 described above. Again, the configuration shown can be used for flip-chip bonding; alternative configurations can support wire bonding. Further, the number and arrangement of bond pads 1014 and/or bond pads 1018 can be modified for a particular chip.

Figure 11:
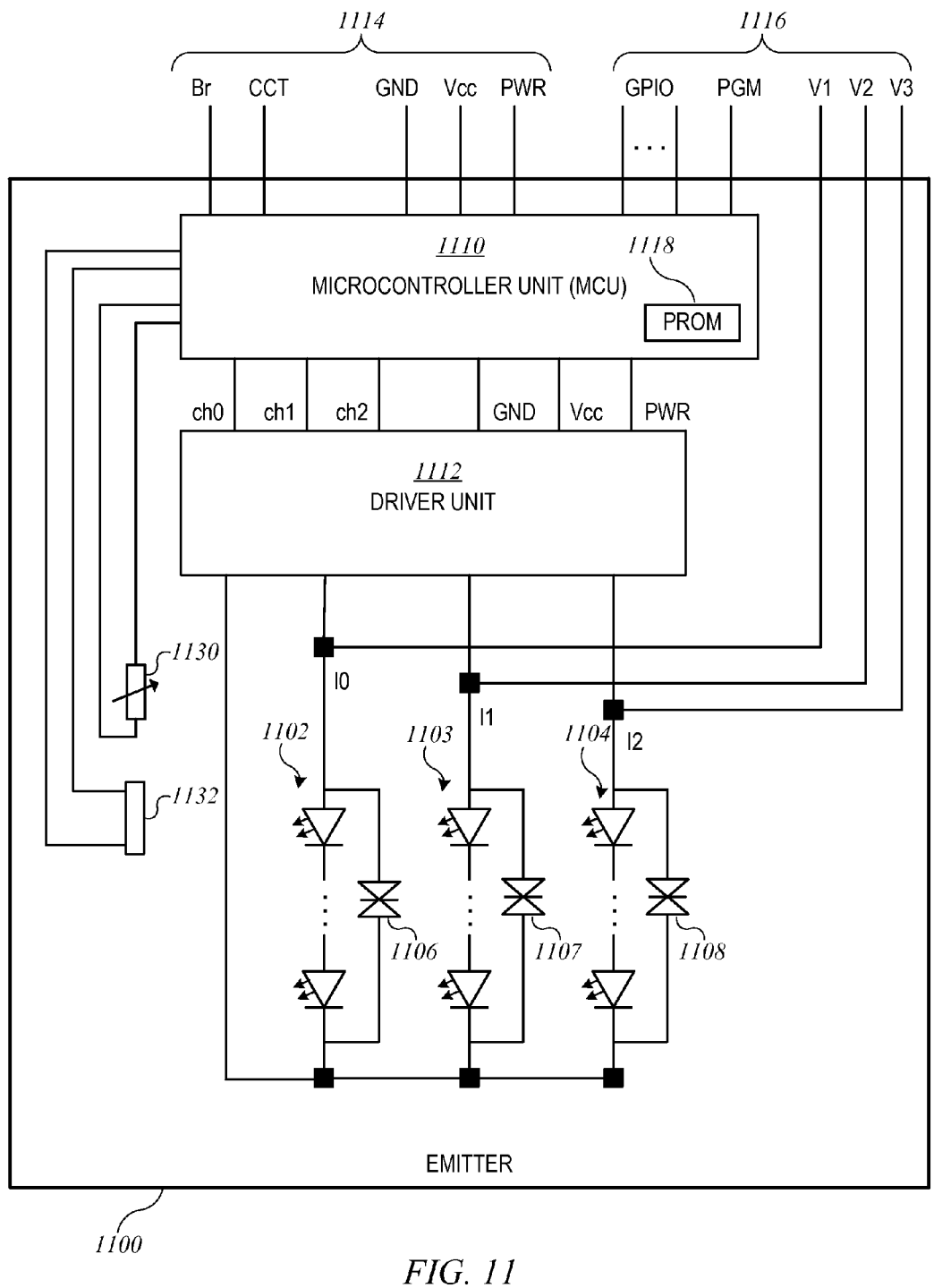
FIG. 11 shows a simplified schematic diagram of an emitter according to another embodiment of the present invention.

FIG. 11 shows a simplified schematic diagram of an emitter 1100 according to an embodiment of the present invention that provides a microcontroller unit and a driver unit as separate supporting chips. Emitter 1100 includes three groups of LEDs 1102, 1103, 1104, each connected in series. It is to be understood that any number of groups of LEDs can be used, that each group can include any number of individual LED chips, and that different groups can include the same number or different numbers of LED chips as desired. The LEDs in different groups can have different color characteristics, e.g., as described above. Transient voltage suppression diodes 1106, 1107, 1108 can be provided for electrical protection as is known in the art.

Emitter 1100 also includes microcontroller unit (MCU) 1110, which can be similar to MCU 910 described above, and driver unit 1112, which can be similar to driver unit 912 described above. In this example, MCU 1110 is connected to operational input signal paths 1114 to receive control inputs, represented here as a brightness signal (Br) and a color-temperature signal (CCT). MCU 1110 is also connected to additional operational signal paths 1114 to receive power (PWR), ground (GND), and operating voltage (Vcc). Operational signal paths 1114 can be exposed to allow external connections during normal device operation. For instance, signal paths 1114 can be connected to external signal pads 916 in the embodiment of FIG. 9, and cover 700 of FIG. 7 can include metal leads 730 arranged to contact the external signal pads 916 corresponding to operational signal paths 1114.

Additional inputs to MCU 1110 can include calibration/programming signal paths 1116. In this example, calibration/programming signal paths 1116 include a number of input/output pins (GPIO) and a program signal pin (PGM). These pins can be used to program a programmable read-only memory (PROM) 1118 during calibration and testing operations. For example, as described below PROM 1118 can be programmed to store a mapping between received brightness (Br) and color-temperature (CCT) signals and control signals to be sent to driver unit 1112. The particular mapping for a given emitter can be determined during a calibration operation. Examples of calibration are described below.

Calibration/programming signal paths 1116 can also include a voltage path (V1, V2, V3) for each group of LEDs. Voltage paths V1, V2, V3 can be used to supply or monitor voltage (or current) delivered to the LEDs during calibration.

Calibration/programming signal paths 1116 can be, but need not be, exposed to allow external connections after calibration and programming of PROM 1118 is complete. For example, calibration/programming signal paths 1116 can be connected to external signal pads 916 in the embodiment of FIG. 9. Calibration and programming can occur before cover 700 (described above) is attached to emitter 1100, and cover 700 need not provide leads that connect to calibration/programming signal paths 1116.

In operation, microcontroller unit 1110 can receive external control inputs, e.g., brightness signal (Br) and color-temperature signal (CCT), via operational signal paths 1114. For example, a user can adjust a setting of a lamp that includes emitter 1100, and the desired setting can be communicated to emitter 1100 using brightness signal (Br) and color-temperature signal (CCT). Based on the external control inputs, microcontroller unit 1110 can determine (e.g., by accessing calibration data stored in PROM 1118) a desired operating current for each LED group 1102, 1103, 1104. Based on the desired operating current, corresponding driver control signals can be sent to driver unit 1112 via driver control signal paths (ch0, ch1, ch2), which can be implemented using metal paths on and/or within the emitter substrate. Driver unit 1112 can also receive power, ground, and operating voltage from microcontroller unit 1110. Based on the driver control signals on paths ch0, ch1, and ch2, driver unit 1112 can generate output currents I0, I1, I2 for LED groups 1102, 1103, 1104. It is to be understood that the control signals for different driver channels (ch0, ch1, ch2) can be independent of each other, and the output currents I0, I1, I2 can also be independent of each other. (During normal operation, paths V1, V2, V3 are not active; in some embodiments, voltage or current can be supplied during calibration using paths V1, V2, V3.) As noted above, the control logic and algorithms used to determine and generate the desired operating currents can be similar to those described in above-referenced U.S. patent application Ser. No. 14/244,787.

In some embodiments, microcontroller unit 1110 can also receive inputs from sensors disposed on or within the emitter and can adjust operating currents based on the sensor data. For example, to prevent overheating, it may be desirable to monitor the temperature of the LEDs and decrease operating current if the temperature becomes too high. It may also be desirable to adjust the relative operating currents for different groups of LEDs based on changes in operating temperatures, e.g., to compensate for possible color shifting in cases where the efficiency of different types of LEDs is affected differently by changes in operating temperature. Accordingly, microcontroller unit 1110 can be connected to a temperature sensor 1130, which can be of generally conventional design and disposed somewhere in emitter 1100, e.g., near the LEDs. This connection can be internal to emitter 1100. Examples of control logic and algorithms for adjusting relative currents based on operating temperature are described in above-referenced U.S. patent application Ser. No. 14/244,787.

Similarly, in some embodiments, it may be desirable for emitter 1100 to automatically adapt to changing ambient light conditions and/or to respond to changes in occupancy (e.g., a person entering or leaving a room where a lamp that includes emitter 1100 is present). Accordingly, microcontroller unit 1110 can be connected to an environmental sensor 1132 that can be disposed within or on an outer surface of emitter 1100 as desired. Environmental sensor 1132 can be, for example, an ambient light sensor or an occupancy sensor (e.g., motion detector or infrared heat sensor or the like); such sensors can be of generally conventional design. The connection to environmental sensor 1132 can be internal to emitter 1100.

It is to be understood that the schematic diagram of FIG. 11 is an example and that variations and modifications are possible. For example, the number of external connections can be varied. In cases where the control circuitry and driver circuitry are integrated into a single chip, the signal paths between control and driver circuits can be internal to the chip. Further, the number of driver channels can be modified to match the number of LED groups.

The emitters described above are illustrative, and variations and modifications are possible. An emitter can have any number of LEDs arranged in any number of independently addressable groups. The "supporting" circuitry (e.g., drivers, current sources, control logic to control the drivers, stored data, etc.) can be integrated into a single semiconductor chip or distributed across two or more semiconductor chips, and the chips implementing supporting circuitry can all be disposed within the emitter. The connection paths can be modified as desired. It is to be understood that an emitter with any number of semiconductor chips providing supporting circuitry can be incorporated into any of the physical configurations shown in FIGS. 6-8.

In the examples described herein, all of the control circuitry and current-generating circuitry is provided using one or more supporting chips that are mounted on the same substrate with the LEDs, e.g., within a recess region. Such configurations, in addition to providing a compact emitter requiring few external electrical connections, can also reduce or eliminate electromagnetic interference that can arise if high-frequency pulsed current from an external source is used to operate the LEDs.

As noted above, in some embodiments, an emitter can be calibrated as part of the manufacturing process, e.g., prior to attaching cover 700. Calibration can include determining the absolute or relative values of currents that will produce particular output colors (e.g., white light of different color temperatures). The calibration data can be stored in a programmable read-only memory (PROM) that can be integrated into the onboard controller/driver chip or microcontroller unit (e.g., PROM 1118 integrated into microcontroller unit 1110; it is to be understood that controller/driver chip 210 of FIG. 2 can also include a PROM). Thus, all control circuitry can be internal to the emitter; no external microprocessors, memories, or current generators are needed.

In some embodiments, the calibration can be performed to provide consistent color quality across emitters. As described above, an emitter can incorporate different groups of LEDs having different colors or color quality (e.g., the bluish white, greenish white, and red LEDs of FIG. 2). By appropriately selecting the relative operating current for each group on a per-emitter basis, a large number of emitters can be tuned to a single color bin (e.g., such that the color of different emitters within the bin are indistinguishable or nearly indistinguishable by the human eye). For example, one color bin can correspond to warm white light with a color temperature (CCT) of about 2800 K while another color bin can be cool white light with a CCT of about 6000 K. Other color bins can also be defined. Some examples of calibration techniques are described in U.S. Pat. No. 8,598,793, the disclosure of which is incorporated by reference herein. Further, in cases where the color (e.g., color temperature) of the light is adjustable during operation, the tuning can define the appropriate relative operating currents for different color settings, such that different emitters produce light of consistent color at the same color setting.

Calibration can be performed by placing an emitter (e.g., emitter 600 of FIG. 6) in a test stand, e.g., prior to attaching cover 700. The test stand can provide electrical contacts that allow a temporary connection of power and calibration control wires to the external contacts of emitter 600 (e.g., contacts 614). Thus, for example, signal paths 1114, 1116 of emitter 1100 of FIG. 11 can all be connected to external wires in the test stand. Control signals on the calibration control wires can be used to instruct the supporting chip(s) to deliver a particular distribution of operating currents to the LED groups, and the test stand can include a spectrometer to measure the color of the resulting light. Based on differences between the measured color and the desired color bin, the current distribution can be adjusted to tune the emitter to a target color bin. Once the desired current distribution for a target color bin has been determined, additional control signals delivered to the emitter can be used to program parameters defining the current distribution that produces light in the target color bin into the PROM of the microcontroller chip (or controller/driver chip), e.g., by using GPIO and PGM signal paths shown in FIG. 11. For applications where the emitter will be usable to provide light of controllably varying color, the calibration process can be repeated for multiple target color bins; for example, the PROM can store a lookup table mapping particular colors or color temperatures to particular sets of parameters for the operating currents, and the controller chip can perform interpolation between entries in the lookup table to generate intermediate colors or color temperatures.

In some embodiments, calibration and programming of the PROM may be performed using dedicated on-chip "calibration" input pads of the microcontroller chip (or controller/driver chip), which can be separate from any input pads that may be provided for receiving control signals during normal (post-calibration) operation. For example, the calibration input pads can connect to signal paths 1116 shown in FIG. 11. During normal operation, an externally-sourced control input signal (e.g., signals received via the Br and/or CCT signal paths shown in FIG. 11) may indicate a desired color temperature and/or brightness, and the microcontroller chip (or controller/driver chip) can determine, using parameters stored in the PROM, the appropriate distribution of operating currents. However, during calibration, the parameters are not yet stored in the PROM, so a different input path may be desirable for specifying a current distribution and/or for directing programming of the PROM. Further, in some embodiments, the on-chip input pads for programming the PROM can be distinct from the control signal input pads (e.g., as shown in FIG. 11), and the microcontroller chip (or controller/driver chip) need not include any additional circuitry to program the PROM (e.g., by generating high-voltage pulses). Thus it may be useful to provide dedicated calibration input pads on the microcontroller chip (or controller/driver chip).

Where the microcontroller chip (or controller/driver chip) provides dedicated on-chip calibration input pads, the external contacts on the emitter (e.g., contacts 614 of FIG. 6) can include additional "calibration" contacts that connect to the on-chip calibration input pads of the microcontroller chip (or controller/driver chip) via metal paths within and/or on the surface of the emitter body as described above. These calibration contacts can be used during the calibration process to apply specific current distributions and to program the PROM once the current distribution that produces light in a target color bin has been determined.

After calibration is complete, the calibration contacts are no longer needed, and cover 700 need not include any metal leads that connect to the calibration contacts. Thus, for example, cover 700 can provide metal leads to connect to operating signal paths 1114 but not to signal paths 1116. The electrically insulating material (e.g., plastic) of cover 700 can prevent accidental electrical contact with the calibration contacts when the emitter is installed in a lamp assembly.

It should be understood that in some embodiments, the microcontroller chip (or controller/driver chip) may support calibration and PROM programming using the same control signal input pins that are used during normal (post-calibration) device operation, in which case dedicated calibration contacts are not required.

Accordingly, in some embodiments, the only external connections required during normal (post-calibration) operation of the emitter are a power connection (e.g., 24 and/or 48 volts; some embodiments may support dual operating voltages) and one or more control signal input paths to allow the light output of the lamp to be controlled (e.g., by adjusting the color and/or varying the brightness). In some embodiments, a separate control signal input path may not be needed during normal operation. For example, the microcontroller chip (or controller/driver chip) may be able to receive control signal inputs via the power path or via a wireless data communication interface (e.g., using Bluetooth, Zigbee, or other standard wireless data communication protocols), or it may be that the emitter is to be operated at a fixed color and brightness, in which case a control signal is not needed during normal operation. Where a control signal input path is not needed during normal device operation, the number of operating signal paths can be reduced to just power and ground.

In some embodiments the microcontroller chip (or controller/driver chip) can incorporate temperature compensation, e.g., control logic to adjust relative operating currents to account for variation in the light output of different LEDs as a function of operating temperature. Because the controller/driver chip is inside the emitter (in the same thermal environment as the LEDs), the controller/driver chip can directly sense the operating temperature and compensate accordingly, or additional temperature sensors can be provided in the emitter (e.g., as shown in FIG. 11). Examples of temperature compensation functionality that can be implemented are described in above-referenced U.S. patent application Ser. No. 14/244,787, although it is to be understood that other techniques can be used.

Further, emitters as described herein can be manufactured at reduced cost. For instance, as noted above, the emitter substrate can be directly mounted on a heat sink and can be electrically connected into a lamp (e.g., light fixture, light bulb, or the like) without first connecting the emitter to a metal-core printed circuit board as is conventionally done. The reduction in the number of external electrical connections can also reduce manufacturing cost as there is no need for cables or connectors.

While the invention has been described with respect to specific embodiments, one skilled in the art will recognize that numerous modifications are possible. The particular dimensions of an emitter; the number, type, and arrangement of LEDs, and the number of independently addressable groups of LEDs can all be varied as desired. For example, there can be two groups of LEDs, three groups, or more than three groups (e.g., five groups or seven groups). The LEDs can include LEDs of any color, and the color may be produced with or without phosphor coating. For instance, it may be desirable to use blue LEDs coated with red phosphor in place of red LEDs. It may also be desirable to use LEDs that produce amber light (e.g., blue LEDs coated with appropriate phosphors). The size, location, and number of electrical connections to the supporting chip(s) can also be varied, e.g., depending on the number of independently addressable groups of LEDs. For instance, multiple driver chips may be used, with each driver chip providing operating current to a different, nonoverlapping subset of the LED groups. Primary and secondary optics, plastic covers, heat sinks, and other structures can also be modified.

In some embodiments, a PROM (or other memory device to store control parameters or the like) can be implemented in a separate chip from the microcontroller chip (or controller/driver chip), with the PROM also being disposed on the emitter substrate and connected to the microcontroller chip (or controller/driver chip) using metal paths and vias on or within the emitter substrate as described above. Where this is the case, dedicated external contacts for programming the PROM can be provided on the emitter, similarly to the calibration/programming signal paths described above.

Thus, although the invention has been described with respect to specific embodiments, it will be appreciated that the invention is intended to cover all modifications and equivalents within the scope of the following claims.

What is claimed is:

1. A substrate for an LED emitter, the substrate comprising:
    a body with a recess region formed therein;
    a plurality of bonding pads disposed within the recess region, the plurality of bonding pads including a plurality of LED bonding pads and a plurality of supporting chip bonding pads;
    a plurality of external electrical contacts disposed outside the recess region; and
    a plurality of electrical paths disposed at least partially within the body of the substrate, the electrical paths connecting the external electrical contacts to a first subset of the supporting chip bonding pads and connecting a second subset of the supporting chip bonding pads to the plurality of LED bonding pads such that a controller/driver chip bonded to the supporting chip bonding pads is operable to deliver different operating currents to different ones of the LEDs in response to a control signal received via one of the external electrical contacts.

2. The substrate of claim 1 wherein the electrical paths connect the LEDs into a plurality of independently addressable groups, each group connected to receive current via a different one of the supporting chip bonding pads.

3. The substrate of claim 1 wherein the electrical paths connect the LEDs into at least three independently addressable groups, each group connected to receive current via a different one of the supporting chip bonding pads.

4. An LED emitter comprising:
    a substrate having:
        a body with a recess region formed therein;
        a plurality of bonding pads disposed within the recess region, the plurality of bonding pads including a plurality of LED bonding pads and a plurality of supporting chip bonding pads;
        a plurality of external electrical contacts disposed outside the recess region; and
        a plurality of electrical paths disposed at least partially within the body of the substrate, the electrical paths connecting the external electrical contacts to a first subset of the supporting chip bonding pads and connecting a second subset of the supporting chip bonding pads to the plurality of LED bonding pads such that a controller/driver chip connected to the supporting chip bonding pads is operable to deliver different operating currents to different ones of the LEDs in response to a control signal received via one of the external electrical contacts;
    a plurality of LEDs disposed in the recess region and connected to the LED bonding pads;
    a controller/driver chip disposed in the recess region and connected to the supporting chip bonding pads; and
    an optically transparent cover disposed over the recess region.

5. The LED emitter of claim 4 wherein the optically transparent cover is sealed to the body.

6. The LED emitter of claim 4 wherein the optically transparent cover includes a primary lens.

7. The LED emitter of claim 4 wherein the optically transparent cover includes a color-mixing rod.

8. The LED emitter of claim 4 wherein the optically transparent cover includes a flat top surface.

9. The LED emitter of claim 4 wherein the supporting chip bonding pads include a first bonding pad usable to provide a calibration control signal to the supporting chip and the external electrical contacts include a calibration contact connected to the first bonding pad via one of the electrical paths.

10. A substrate for an LED emitter, the substrate comprising:
    a body with a recess region formed therein;
    a plurality of bonding pads disposed within the recess region, the plurality of bonding pads including a plurality of LED bonding pads, a plurality of microcontroller unit bonding pads, and a plurality of driver unit bonding pads;
    a plurality of external electrical contacts disposed outside the recess region; and
    a plurality of electrical paths disposed at least partially within the body of the substrate, the electrical paths connecting the external electrical contacts to a first subset of the microcontroller unit bonding pads, connecting a second subset of the microcontroller unit bonding pads to a first subset of the driver unit bonding pads, and connecting a second subset of the driver unit bonding pads to the plurality of LED bonding pads such that a driver unit connected to the driver unit bonding pads is operable to deliver different operating currents to different ones of the LEDs in response to control signals received from the microcontroller unit.

11. The substrate of claim 10 wherein the electrical paths connect the LEDs into a plurality of independently addressable groups, each group connected to receive current via a different one of the controller pads.

12. The substrate of claim 10 wherein the electrical paths connect the LEDs into at least three independently addressable groups, each group connected to receive current via a different one of the controller pads.

13. An LED emitter comprising:
    a substrate having:
        a body with a recess region formed therein;
        a plurality of bonding pads disposed within the recess region, the plurality of bonding pads including a plurality of LED bonding pads, a plurality of microcontroller unit bonding pads, and a plurality of driver unit bonding pads;
        a plurality of external electrical contacts disposed outside the recess region; and
        a plurality of electrical paths disposed at least partially within the body of the substrate, the electrical paths connecting the external electrical contacts to a first subset of the microcontroller unit bonding pads, connecting a second subset of the microcontroller unit bonding pads to a first subset of the driver unit bonding pads, and connecting a second subset of the driver unit bonding pads to the plurality of LED bonding pads such that a driver unit connected to the driver unit bonding pads is operable to deliver different operating currents to different ones of the LEDs in response to control signals received from the microcontroller unit;

a plurality of LEDs disposed in the recess region and connected to the LED bonding pads;

a microcontroller unit disposed in the recess region and connected to the microcontroller unit bonding pads;

a driver unit disposed in the recess region and connected to the driver unit bonding pads; and an optically transparent cover disposed over the recess region.

14. The LED emitter of claim 13 wherein the optically transparent cover is sealed to the body.

15. The LED emitter of claim 13 wherein the optically transparent cover includes a primary lens.

16. The LED emitter of claim 13 wherein the first subset of microcontroller unit bonding pads includes at least one bonding pad to receive an input signal indicating a target brightness of light to be produced using the LEDs.

17. The LED emitter of claim 13 wherein the first subset of microcontroller unit bonding pads includes at least one bonding pad to receive an input signal indicating a target color temperature of light to be produced using the LEDs.

18. The LED emitter of claim 13 wherein the second subset of microcontroller unit bonding pads includes a plurality of pads to transmit driver control signals from the microcontroller unit to the driver unit and wherein the driver unit is configured to generate the operating currents based on the driver control signals.

19. The LED emitter of claim 18 wherein the microcontroller unit includes a programmable read-only memory and a first subset of microcontroller unit bonding pads includes at least one bonding pad connected to circuitry in the microcontroller unit to program the programmable read-only memory.

20. The LED emitter of claim 13 wherein the microcontroller unit and the driver unit are connected to the microcontroller unit bonding pads and the driver unit bonding pads, respectively, by flip-chip bonding.

* * * * *